US006790588B2

(12) United States Patent
Turner et al.

(10) Patent No.: US 6,790,588 B2
(45) Date of Patent: Sep. 14, 2004

(54) IMAGABLE ARTICLES AND COMPOSITIONS THEREFOR

(75) Inventors: Gregory Turner, Leeds (GB); Denise Howard, Sherburn-in-Elmet (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/013,141

(22) Filed: Dec. 10, 2001

(65) Prior Publication Data

US 2004/0048186 A1 Mar. 11, 2004

(51) Int. Cl.[7] .................................................. G03F 7/09

(52) U.S. Cl. ..................... 430/270.1; 430/964; 101/453

(58) Field of Search ........................... 430/270.1, 281.1, 430/281.3, 286.1, 287.1, 288.1, 302, 309, 348, 401, 434, 494, 944, 945, 964; 101/453, 463.1, 465, 466, 467

(56) References Cited

U.S. PATENT DOCUMENTS

| | | | | | |
|---|---|---|---|---|---|
| 4,961,960 | A | | 10/1990 | Iimure | 427/54.1 |
| 4,997,745 | A | | 3/1991 | Kawamura et al. | 430/281 |
| 5,372,907 | A | | 12/1994 | Haley et al. | 430/157 |
| 5,663,037 | A | * | 9/1997 | Haley et al. | 430/278.1 |
| 5,837,586 | A | * | 11/1998 | Perron | 430/285.1 |
| 6,051,361 | A | * | 4/2000 | Hattori et al. | 430/270.1 |
| 6,136,425 | A | * | 10/2000 | Akiyama et al. | 428/314.2 |
| 6,423,462 | B1 | * | 7/2002 | Kunita | 430/156 |
| 6,534,238 | B1 | * | 3/2003 | Savariar-Hauck et al. | 430/270.1 |
| 2003/0129520 | A1 | * | 7/2003 | Oohashi et al. | 430/138 |

FOREIGN PATENT DOCUMENTS

| | | | |
|---|---|---|---|
| EP | 854388 | 7/1998 | |
| EP | 903225 | 3/1999 | |
| JP | 07-271029 | * 10/1995 | G03F/7/029 |

* cited by examiner

*Primary Examiner*—Barbara Gilliam
(74) *Attorney, Agent, or Firm*—Faegre & Benson, LLP

(57) ABSTRACT

Disclosed is a thermally sensitive imagable article and compositions therefor. The imagable article comprises a coating on a substrate, the coating comprising an amino acid or amide, and a compound capable of generating an acid upon heating. The coating optionally comprises a radiation absorbing compound. When imagewise exposed the coating has the property that exposed regions become relatively insoluble in a developer liquid whereas regions that have not been exposed remain relatively soluble in the developer and dissolve in the developer, leaving the exposed substrate in those regions.

11 Claims, No Drawings

IMAGABLE ARTICLES AND COMPOSITIONS THEREFOR

BACKGROUND OF INVENTION

1. Field of the Invention

The invention relates to amino acid and amides and their use in imagable articles. In particular the invention relates to amino acid or amide-containing compositions and to their use in heat-sensitive film-forming coatings for imagable articles.

2. Background to the Invention

Imagable articles, such as lithographic printing form precursors, electronic part precursors and mask precursors, conventionally comprise a substrate onto which is coated a film-forming radiation-sensitive composition. After imagewise exposure of the precursor to radiation of suitable wavelength, and development of the imaged precursor, an imaged article is produced.

Negative working imagable article precursors have a radiation sensitive coating, which, when imagewise exposed to radiation of a suitable wavelength, hardens in the exposed areas. On development, the non-exposed areas of the coated composition area removed, leaving the image.

The coatings are normally laid down as solutions in organic solvents, which are removed by evaporation. Conventionally, ultra-violet or visible radiation has been employed to image compositions sensitive to radiation of those wavelengths. Recently infra-red (IR) radiation has become of interest.

In many proposals the compositions contain IR absorbers which convert IR radiation to heat, and it is the heat which is the direct cause of the hardening in the negative-working compositions. A heated body delivering heat conductively to corresponding compositions not containing IR absorbers can likewise effect a solubility change. A suitable IR radiation source is an IR laser digitally controlled to produce the required pattern of heated areas. Thus, these compositions are suitable for advanced "Computer-to-Plate" (CTP) techniques. Some compositions, which are not additionally sensitive to ultra-violet or visible radiation offer the advantage, over traditional photosensitive recording compositions, that they do not need to be handled in a dark room, or under ultra-violet safelighting conditions, but can simply be handled in ordinary light.

There are many examples of negative working compositions which are sensitive to IR radiation, and which are used in coatings on imagable articles. Many such negative working compositions utilise acid-polymerisable monomers in conjunction with a radiation absorbing compound and a compound capable of generating an acid upon heating.

U.S. Pat. No. 4,961,960 discloses photo-curable coating compositions comprising a photo-curable monomer or polymer, and a compound having a blocked isocyanate group and at least one ethylenically unsaturated group. These coatings are cured by exposure to ultra-violet light.

U.S. Pat. No. 4,997,745 discloses photopolymerisable compositions comprising a trihalomethyl-s-triazine compound, a photosensitiser in the form of an IR dye and a polymerisable compound having at least one ethylenically unsaturated group.

EP 854,388 discloses a negative-working image record material containing a polymer having a heterocyclic group containing an unsaturated bond therein, a cross-linking agent that cross-links with the aid of an acid, and a compound that generates an acid on exposure to light or heat.

U.S. Pat. No. 5,372,907 discloses a radiation sensitive composition adapted to be sensitive to both ultra-violet and infra-red radiation and capable of functioning in either a positive- or negative-working manner, the composition comprising a resole resin, a novolac resin, a latent Bronsted acid and an infra-red absorber. The solubility of the composition in aqueous alkaline developing solution is both reduced in exposed areas and increased in unexposed area by imagewise exposure to radiation and heating.

EP 903,225 discloses a light sensitive composition comprising an acid generating compound, an infra-red absorbing compound, either a compound which is decomposable by acid or a compound having a group which is cross-linkable by an acid, and a polymer obtained from a polymerisable composition comprising an ethylenically unsaturated monomer.

The prior compositions display disadvantages in use as coatings for imagable articles. Some of the prior art compositions in which polymerisation occurs suffer from the fact that there is no efficient termination stage during polymerisation, which can lead to inconsistencies in the molecular weight distribution of the polymer on the substrate of the imagable article, and hence inconsistent image and non-image areas. Other monomers used in prior art compositions are prohibitively expensive or have difficult synthetic pathways.

It is therefore an object of the present invention to provide a negative-working radiation sensitive composition which overcomes at least some of the disadvantages displayed by the prior art.

The applicants have surprisingly found that the use of amino acid and amides, in conjunction with a compound capable of generating an acid on heating, and preferably with an IR absorbing compound, provides a negative-working composition which has an efficient termination stage during polymerisation and which is cheap and easy to manufacture. Furthermore amino acids and amides may be incorporated as pendent groups on polymeric substances suitable for use in negative-working compositions.

SUMMARY OF THE INVENTION

According to the present invention there is provided an imagable article comprising a thermally imagable coating on a substrate, the coating comprising a compound capable of generating an acid upon heating, and an amino acid or amide compound or moiety capable of polymerizing when said compound generates an acid on heating.

DETAILED DESCRIPTION OF THE INVENTION

The present invention provides an imagable article comprising a thermally imagable coating on a substrate, the coating comprising a compound capable of generating an acid upon heating, and an amino acid or amide compound or moiety capable of polymerizing when said compound generates an acid on heating. Preferably the coating further comprises a compound capable of absorbing radiation and converting it to heat.

The coating may be dissolved in a solvent and applied to the substrate in liquid form, from which the solvent is preferably removed by evaporation.

Preferably the coating comprises a composition including the amino acid or amide and the acid generating compound in admixture. More preferably the coating comprises a composition including the amino acid or amide, the acid generating compound and the radiation absorbing compound in admixture.

Alternatively the coating may comprise at least two layers and the radiation absorbing compound is provided in a separate layer to the amino acid or amide and the acid generating compound.

In one embodiment of the invention the radiation absorbing compound may be provided in an underlayer of the coating and the amino acid or amide and the acid generating compound are provided in an overlayer of the coating, the underlayer being applied to the substrate first, and the overlayer being applied on top of the underlayer.

Suitable amino acids include linear amino acid having the general formula (I) below:

$$HOOC—(CH_2)_n—NH_2 \quad (I)$$

where n is 1 to 20, preferably 1 to 12.

Particularly useful amino acids of formula (J) include 6-aminocaproic acid and 12-aminododecanoic acid.

Preferably the amide is a cyclic amide.

Suitable cyclic amides include lactams of general formula (II) below, and their derivatives:

(II)

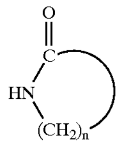

where n is 2 to 10, preferably 3 to 6.

Particularly suitable lactams of formula (II) include caprolactam and valerolactam. Preferably the caprolactam is δ-caprolactam, and the valerolactam is ϵ-valerolactam.

Suitable lactam derivatives include vinyl lactams.

Other suitable cyclic amides include 2-azacyclotridecanone, or 4-azatricycloundecan-5-one.

Suitably the amino acid or amide constitutes at least 50% of the total weight of the coating, preferably at least 60%, more preferably at least 70% and most preferably at least 80% of the total weight of the coating.

Suitably the amino acid or amide constitutes no more than 95% of the total weight of the coating, preferably no more than 90% and most preferably no more than 86% of the total weight of the coating.

Thus a preferred range for the weight of amino acid or amide is 80 to 86% of the total weight of the coating.

The amino acid or amide compound or moiety, may be present as pendent groups on a polymeric substance.

In all cases, the figures given are as a percentage of the total weight of the dried coating.

Suitable compounds capable of generating an acid upon heating include s-triazine compounds substituted with at least one trihalomethyl group and includes substituted trichloromethyl-s-triazines of known type. Suitable s-triazines include 4-methoxyphenyl-4, 6-bis (trichloromethyl)-s-triazine, 2-[4-(2 methoxy)naphtha-1-yl]-4, 6-bis (trichloromethyl)-s-triazine, 2-(4-methylthiophenyl)-4, 6-bis(trichloromethyl)-s-triazine, 2,4, 6-tris (trichloromethyl)-s-triazine and a s-triazine corresponding to formula III below.

III

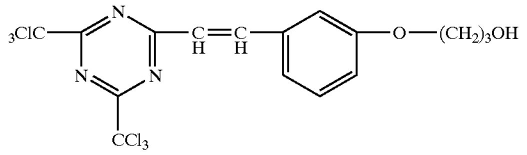

Other suitable acid generating compounds include iron-arene complexes such as (2,4-cyclopentadien-1-yl)[(1,2,3,4, 5,6)-(1-methylethyl)benzene]-iron(I)-hexa-fluorophosphate, ($\eta^6$-isopropylbenzene) ($\eta^5$-cyclopentadie-nyl) iron(II) hexafluorophosphate, ($\eta^6$-xylene)($\eta^5$-cyclo -pentadienyl) iron(II)hexafluoroantimonate and the like, and onium salts such as diaryliodonium salts, triarylsulfonium salts, triarylselenonium salts, dialkylphenacylsulfonium salts, dialkyl-4-hydroxyphenol sulfonium salts, and aryldiazonium salts.

Particularly preferred onium salts include diphenyl iodonium hexafluorophosphates, triaylsulfonium hexafluorantimonates, triarylsulfonium hexafluorophosphonates. Yet more suitable acid generating compounds include nitrobenzyl esters such as p-toluenesulphonic acid ester of p-nitrobenzyl alcohol and the like, sulfonic acid esters such as—hydroxymethylbenzenesulfonic acid esters and the like, pyridinium and pyridine compounds such as methoxyphenylpyridinium chloride, 2-[(tribromomethyl) sulfonyl]pyridine and the like.

Suitably the acid generating compound constitutes at least 1%, preferably at least 2%, more preferably at least 5% of the total weight of the coating. Suitably the acid generating compound constitutes up to 15%, preferably up to 12% and more preferably up to 10% of the total weight of the coating.

Thus, a preferred range for the amount of acid-generating compound is 5–10% by weight of the total weight of the coating.

The imagable article may comprise a precursor to an electronic part, especially a precursor to a printed circuit board (PCB), or a mask precursor, but preferably the imagable article comprises a precursor to a lithographic printing form.

The substrate of the imagable articles may be constructed of any suitable material including metals, plastics materials, alloys, paper and polymeric materials.

When the imagable article of the invention in a precursor for a lithographic printing form the substrate may comprise a metal surface. Preferred metals include aluminium, zinc and titanium, or alloys thereof. Other alloys that may be useful include brass and steel. The substrate may be an aluminium plate which has undergone the usual anodic graining and post-anodic treatments well known in the lithographic art for enabling thermally imagable coating to be applied thereon. Another substrate which may be used in the present invention where the precursor is a precursor for a lithographic printing form, is a plastics material base or treated paper base as used in the photography industry. A particularly useful plastics material base is polyethylene terephthalate which has been subbed to render its surface hydrophilic. Also a so-called coated paper which has been corona discharge treated can be used.

When the imagable article of the invention is a precursor for an electronic part, the substrate preferably comprises an insulating material such as an insulating plastics material. Suitable plastics materials include polyethylene terephthalate, epoxy resins, phenolic resins, polyamides, and cellulose triacetate. The plastics material may be reinforced by fibres, preferably glass fibres. Other suitable materials for use as substrates in a precursor to an electronic part include quartz and silicon.

A large number of compounds, or combinations thereof, can be utilised as radiation absorbing compounds in the present invention.

In preferred embodiments the radiation absorbing compound absorbs infra-red radiation, for example 1064 nm radiation from a Nd—YAG laser. However, other materials which absorb other wavelength radiation e.g. 488 nm radiation from an Ar-ion laser source, may be used with the radiation being converted to heat by the radiation absorbing compound.

The radiation absorbing compound may usefully be a pigment, which is a black body or broad band absorber.

Preferably, the pigment is able to efficiently absorb electromagnetic radiation and convert it to heat over a range of wavelengths exceeding 200 nm. Preferably exceeding 400 nm. Generally they are not decomposed by the radiation. Suitable pigments include carbon black, lamp black, channel black, furnace black, iron blue, insoluble azo pigments, azo lake pigments, condensed azo pigments, chelate azo pigments, phthalocyanine based pigments, anthraquinone based pigments, perylene or perynone based pigments, thioindigo based pigments, quinacridone based pigments, dioxazine based pigments, vat dyeing lake pigments, azine pigments, nitroso pigments and nitro pigments.

Especially preferred pigments are carbon black, lamp black, channel black, furnace black and iron blue.

Alternatively the radiation absorbing compound may be a dye. Dyes are generally narrow band absorbers typically able efficiently to absorb electromagnetic radiation and convert it to heat only over a range of wavelengths typically not exceeding 100 nm, and so have to be selected having regard to the wavelength of the radiation which is to be used for imaging. Suitable dyes include squarylium based dyes, merocyanine based dyes, cyanine based dyes, indolizine based dyes, pyrylium based dyes and metal dithioline based dyes.

Examples of suitable dyes include:

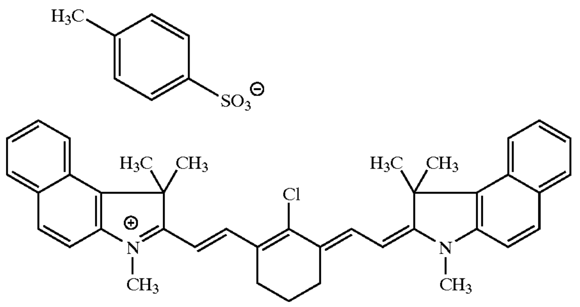

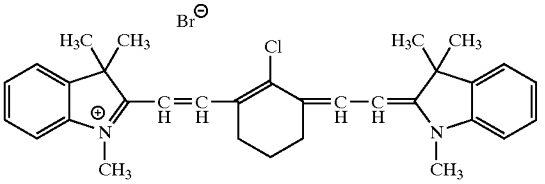

and

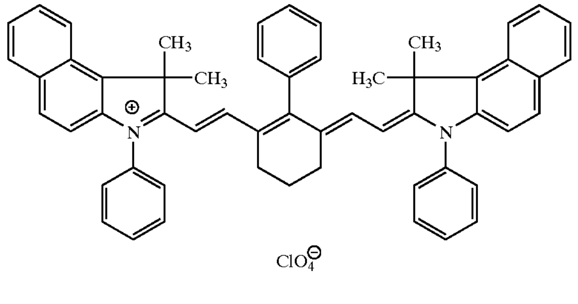

Suitably the radiation absorbing compound constitutes at least 0.25%, preferably at least 0.5%, more preferably at least 1%, most preferably at least 2% of the total weight of the coating. Suitably the radiation absorbing compound constitutes up to 25%, preferably up to 20%, more preferably up to 15% and most preferably up to 10% of the total weight of the coating. More specifically, the range is preferably 0.25–15% of the total weight of the coating, more preferably 0.5–10%. In all cases the figures given are as a percentage of the total weight of the dried coating.

There may be more than one radiation absorbing compound. References herein to the proportion of such compound(s) are to their total content.

Suitably, the weight of the coating on the substrate is no more than 2.5 $gm^{-2}$, preferably no more than 2.0 $gm^{-2}$, and more preferably no more than 1.5 $gm^{-2}$. Suitably the weight of the coating is at least 0.5 $gm^{-2}$, preferably at least 0.6 $gm^{-2}$ and more preferably at least 0.75 $gm^{-2}$. Thus a preferred range of coating weight on the substrate is between 0.75 and 1.5 $gm^{-2}$.

According to a second aspect of the present invention there is provided a composition comprising an amino acid or amide, a compound capable of generating an acid on heating, and a compound capable of absorbing radiation and converting it to heat, the composition having the property that when provided as a coating on a substrate, regions which have been imaged selectively have a first solubility in a developer liquid, whereas regions which have not been imaged have a second solubility in a developer liquid, and wherein the second solubility is greater than the first solubility.

In the specification when we state that a coating is developer soluble we mean that it dissolves in a selected developer, to an extent useful in a lithographic printing form development process. When we state that a coating is developer insoluble we mean that it does not dissolve in the selected developer, to an extent useful in a lithographic printing form development process.

The amino acid, amide, acid generating compound and radiation absorbing compound may be defined as above.

According to a third aspect of the invention there is provided a method of manufacturing an imagable article of the first aspect of the invention, the method comprising the steps of applying the coating of the invention defined herein, to a substrate.

Suitably the coating is dissolved in a solvent and applied to the substrate in liquid form. The solvent may then be removed by evaporation. Alternatively, the coating may be applied to a plastics film, the film bearing the coating then being heat laminated to the substrate.

Where the coating comprises more than one layer, the method may comprise applying an underlayer comprising the radiation absorbing compound to a substrate, and subsequently applying an overlayer comprising the amino acid or amide and acid-generating compound on top of the underlayer. Preferably each layer of the coating is dissolved in a solvent and applied in liquid form, the solvent being substantially removed by evaporation.

According to a fourth aspect of the present invention there is provided a method of manufacturing an imaged article from the imagable article of the invention as defined herein, the method comprising the steps of:

a) exposing the coating as described herein imagewise; and b) removing the non-exposed regions of the coating, using a developer liquid.

The imaging of selected areas may be effected by the use of a heated body. For example the imagable article, either the reverse face, or preferably, the heat sensitive composition, may be contacted by a heated body, such as a heat stylus.

Preferably the imaging of selected areas is preferably effected by the use of infra-red electromagnetic radiation, the coating comprising an infra-red absorbing compound as defined above. By infra-red radiation we mean electromagnetic radiation having a wavelength substantially between 600 nm and 1400 nm.

In preferred methods the electromagnetic radiation employed for exposure is of wavelength at least 600 nm, preferably at least 700 nm and more preferably at least 750 nm. Most preferably it is at least 800 nm. Suitably the radiation is of wavelength not more than 1400 nm, preferably not more than 1300 nm, more preferably not more than 1200 nm and most preferably not more than 1150 nm. A preferred range of electromagnetic radiation employed for exposure is between 700 nm and 1200 nm.

The radiation may be delivered by a laser under digital control. Examples of lasers which can be used to expose coatings suitable for the method of the present invention include semiconductor diode lasers emitting between 600 nm and 1400 nm, especially between 700 nm and 1200 nm. One example is the Nd YAG laser used in the Barco Crescent 42/T thermal image setter which emits at 1064 nm and another is the diode laser used in the Creo Trendsetter thermal image setter, which emits at 830 nm, but any laser of sufficient imaging power and whose radiation is absorbed by the coating can be used.

After imaging, the imaged article may be subjected to a heating step before development of the imaged article. The heating step may comprise heating the imaged article to a temperature of at least 80° C., preferably at least 90° C., more preferably at least 100° C. and most preferably at least 120° C. Preferably the heating step comprises heating the imaged article to a temperature of no more than 250° C., most preferably no more than 150° C.

Thus, a preferred temperature range for the heating step is 120–150° C.

When the imaged article is subjected to a heating step before development of the imaged article, preferably the imaging is effected using an imaging energy of at least 25 $mJcm^{-2}$, preferably at least 50 $mJcm^{-2}$, and more preferably at least 75 $mJcm^{-2}$. When the imaged article is subjected to a heating step before development, preferably the imaging is effected using an imaging energy of no more than 500 $mJcm^{-2}$, more preferably no more than 400 $mJcm^{-2}$, most preferably no more than 300 $mJcm^{-2}$.

When the imaged article is not subjected to a heating step before development, preferably the imaging is effected using an imaging energy of at least 100 $mJcm^{-2}$, more preferably at least 200 $mJcm^{-2}$, and most preferably at least 300 $mJcm^{-2}$.

When the imaged article is not subjected to a heating step before development, preferably the imaging is effected using an imaging energy of no more than 5 $Jcm^{-2}$, more preferably no more than 4 $Jcm^{-2}$, and most preferably no more than 3 $Jcm^{-2}$.

Suitably the developer liquid is an aqueous developer. Common components of aqueous developers are surfactants, chelating agents such as salts of ethylenediamine tetraacetic acid, organic solvents such as alkoxyalcohols, benzyl alcohol and phenoxy alcohol, phosphates and alkaline components such as inorganic metasilicates, hydroxyides and carbonates, and mixtures of the foregoing.

In accordance with a fifth aspect of the present invention there is provided an article comprising a substrate, bearing an image thereon, produced by the method of the fourth aspect. The article may be an electronic part or mask, but is preferably a lithographic printing form.

In accordance with a sixth aspect of the present invention there is provided an imagable article having a thermally imagable coating on a substrate, the coating comprising an amino acid or amide, an acid generating compound, and a radiation absorbing compound, the coating being able to absorb incident radiation in the wavelength range 600–1400 nm and convert it to heat, the coating having the property that when provided on a substrate, imagewise exposed and subjected to a developer, in regions that have been exposed, the thermally imagable coating has a first solubility in the developer, and regions that have not been exposed have a second solubility in the developer, greater than the first solubility, and dissolve in the developer, leaving the substrate exposed in those regions.

The following examples more particularly serve to illustrate the present invention described hereinabove.

Materials and Equipment

The following materials are referred to hereinafter.

Developer A: Kodak Polychrome Graphics 956 Developer—supplied by Kodak Polychrome Graphics, Leeds, UK.

Fount Solution A: Emerald Fountain Solution—supplied by Kodak Polychrome Graphics LLC.

Substrate A: 0.3 mm sheet lithographic 1050 grade aluminium which has been electrograined, anodised and given a post-anodic treatment step using a phosphating agent to produce a standard lithographic support.

IR Dye A: an 830 nm absorbing dye having the structure:

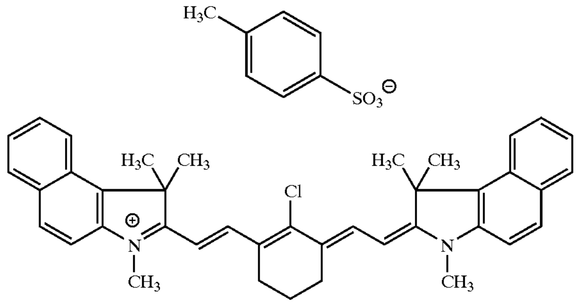

Triazine A: 4-Methoxy-phenyl 4,6-bis(trichloromethyl)-s-triazine supplied by Panchim, 28 rue du Bois Chaland, CE 2950, Lisses, 91029 EVRY Cedex, France.

Triazine B: 2-[4-(2-Methoxy)naphtha-1-yl]-4,6-bis (trichloromethyl)-s-triazine supplied by Panchim.

Triazine C: 2-[4-Methylthiophenyl)-4,6-bis(trichloromethyl)-s-triazine supplied by Lancaster Synthesis Ltd, Morecambe, Lancashire.

Triazine 133–38: Triazine supplied by Panchim, having the structure:

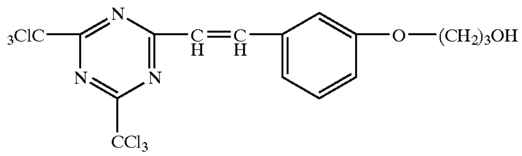

IRGACURE 261 (2,4-Cyclopentadien-1-yl)[1,2,3,4,5,6)-(1-methylethyl) benzene]-iron(1+)-hexafluorophosphate supplied by Ciba-Geigy, Macclesfield, Cheshire.

Diphenyl Iodonium Hexafluorophosphate supplied by Aldrich, Gillingham, Dorset.

CYRACURE UVI 6990 mixed triarylsulphonium hexafluoroantimonate salt supplied Union Carbide.

CYRACURE UVI 6974 mixed triarylsulphonium hexafluorophosphate salt supplied by Union Carbide.

Methoxy Phenyl Pyridinium Chloride supplied by Aldrich.

BSP 2-[(Tribromomethyl)Sulphonyl]pyridine supplied by Sumitomo Seika Chemical company, Osaka, Japan.

NACURE 2530 Thermal acid generator supplied by King Industries, Norwalk, Conn.

Delta caprolactam supplied by Aldrich.

Epsilon valerolactam supplied by Aldrich.

Vinyl caprolactam supplied by Aldrich.

2-Azacyclotridecanone supplied by Aldrich.

6-Aminocaproic acid supplied by Aldrich.

12-Aminododecanoic acid supplied by Aldrich.

2-Methoxy propanol supplied by Aldrich.

Meyer Bars (Wire wound coating bars used for the application of thermally sensitive coatings) supplied by RK Print-Coat Instruments Ltd, Herts, UK.

Mathis Labdryer type LTE Oven supplied by Werner Mathis AG, Zurich, Switzerland.

EXAMPLE 1

Caprolactam and IR Dye A were mixed in the following proportions, by weight of the dry composition.

95% Caprolactam

5% IR Dye A

The formulation was dissolved in 2-methoxypropanol to give a 10% w/w solution. The solution was coated onto Substrate A using a Meyer bar and the solvent allowed to evaporate, to give a dry coating weight of 1.0 $gm^{-2}$ of the composition above. The plates were then further dried in a Mathis Labdryer at 100° C. for 60 seconds.

The coated substrate to be imaged was cut into a circle of 105 mm diameter and placed on a disc that could be rotated at constant speed. Adjacent to the spinning disc, a translation table held the source of the laser beam impinged normal to the coated substrate, whilst the translating table moved the laser beam in a linear fashion with respect to the spinning disc. The imagewise exposure was in the form of a spiral whereby the image in the centre of the spiral represented slow laser scanning speed and long exposure time, and the outer edge of the spiral represented fast scanning speed and short exposure time.

The laser used was a single mode 830 mm wavelength 200 mW laser diode which was focused to a 10 micron resolution. The laser power supply was a stabilised constant current source. After imaging, a pre-heat stage prior to development was carried out if required, the plate being placed on a Mathis Labdryer type LTE oven for 2 minutes at 130° C.

After imaging, the disc was developed by immersing it in 10–20% v/v (aq) Developer A at a temperature of 20° C. until full development was achieved. Full development was achieved when all coating was removed from areas where the laser had not exposed the plate, leaving the exposed spiral pattern. The larger the diameter of the resulting spiral image corresponded to less exposure required to form an image which was resistant to the developer treatment.

The results of the processing, using this formulation are given below.

| Acid Generator | Plate image at 200 rpm | Plate image at 1000 rpm (with Pre-heat Stage) |
|---|---|---|
| None | No image formed | No image formed |

The results of this experiment showed that without the use of an acid-generating compound, the imagable composition showed no sensitivity to imaging.

EXAMPLES 2 to 8

The method of Example 1 was repeated, but with the compositions containing various acid-generating compounds. The proportions of the ingredients in the compositions were as follows:

85% Caprolactam

4% IR Dye A

10% Acid generator

All percentages given are as w/w of the dried coating.

The results of the experiments after imaging and development of the plates, are given in the table below:

| Example | Acid generator | Plate image at 200 rpm | Plate image at 1000 rpm (with Pre-heat Stage) |
|---|---|---|---|
| 2 | Triazine C | Image to edge (<367 mJ) | Image broken halfway to edge (147 mJ) |
| 3 | Triazine A | Image to edge (<367 mJ) | Image almost to edge (73 mJ) |
| 4 | Triazine B | Image to edge (<367 mJ) | Image almost to edge (73 mJ) |
| 5 | Triazine 133–38 | Image to edge (<367 mJ) | Image almost to edge (73 mJ) |
| 6 | Irgacure 261 | Image almost to edge (459 mJ) | Image broken halfway to edge (216 mJ) |
| 7 | Cyracure UVI 6990 | Image broken at centre (3670 mJ) | Slight image at centre (524 mJ) |
| 8 | Cyracure UVI 6974 | Slight image at centre (2620 mJ) | Slight image at centre (524 mJ) |

The results show that acceptable images are produced using caprolactam with s-triazine acid generators, without the use of a pre-heat stage, at slower imaging speeds.

Plate speed is considerably improved by use of a pre-heat stage, but imaging is achievable without pre-heating.

EXAMPLES 9 to 14

The method of Examples 1 to 8 was repeated, but using the following compositions containing Triazine 133–38 as the acid generator, and various amino acid, lactams and lactam derivatives:

86% lactam, lactam derivative or amino acid

4% IR Dye A

10% Triazine 133–38

All percentages given are as w/w of the dried coating.

The results of the experiments after imaging and development of the plates are given in the table below:

| Example | Lactam or Amino acid | Plate image at 1000 rpm (with Pre-heat Stage) | Operating Speed |
|---|---|---|---|
| 9 | Caprolactam | Image complete to edge | 73 mJ |
| 10 | Vinyl caprolactam | Image complete or ⅔ of plate, acceptable to edge | 111 mJ |
| 11 | Valerolactam | Slight image near plate centre | 367 mJ |
| 12 | 2-azacyclotridecanone | Slight image near plate centre | 367 mJ |
| 13 | 6-aminocaproic acid | Image broken halfway to edge | 147 mJ |
| 14 | 12-aminododecanoic acid | Image broken ⅔ to to edge, acceptable to edge | 216 mJ |

The results showed that images were formed using all amino acid and lactams but the use of caprolactam gave excellent results.

The plate comprising the composition from Example 9 including caprolactam was tested for abrasion resistance. A plate was imaged and developed such that a checkerboard image was produced. An oscillating metal weight with a tapered edge (543 gms) which had been covered with an underblanket, so that only the underblanket came into contact with the plate, was used to abrade the image on the plate. The underblanket and weight were moved horizontally (approximately 1 oscillation per 3 seconds) across the plate surface using 3% Fount solution A as a lubricant and visually monitored over 30 minutes.

After 30 minutes of testing the image on the plate remained intact, indicating that the composition including caprolactam has excellent abrasion resistance.

The results show that a composition comprising caprolactam, an s-triazine acid generator and an IR dye produces plates having optimum imaging speed and resolution, and forming an image which has excellent abrasion resistance.

The invention has been described in detail with particular reference to preferred embodiments thereof, but it will be understood that variations and modifications can be effected within the spirit and scope of the invention.

The invention claimed is:

1. An imagable article comprising a thermally imagable coating on a substrate, the coating comprising a compound capable of generating an acid upon heating and an amide moiety capable of polymerizing when said compound generates an acid on heating, wherein the amide noiety is 2-azacyclotridecanone or 4-azatricycloundecon-5-one.

2. An imagable article as claimed in claim 1, wherein the coating further comprises a compound capable of absorbing radiation and converting it to heat.

3. An imagable article as claimed in claim 2, wherein the radiation absorbing compound is an infra-red radiation absorbing compound.

4. An imagable article as claimed in claim 2, wherein the infra-red absorbing compound is an infra-red absorbing pigment or dye.

5. An imagable article as claimed in claim 2, where the amide moiety, the acid-generating compound and the radiation absorbing compound are in admixture.

6. An imagable article as claimed in claim 1, wherein the amide moiety constitutes a least 80% of the total weight of the coating.

7. An imagable article as claimed in claim 1, wherein the amide moiety is present as pendent groups on a polymeric substance.

8. An imagable article as claimed in claim 1, wherein the acid-generating compound is an s-triazine substituted with at least one trihalomethyl group.

9. An imagable article as claimed in claim 8, wherein the s-triazine has the formula:

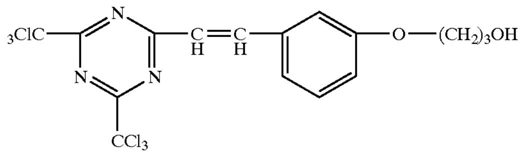

10. An imagable article as claimed in claim 1, wherein the acid-generating compound constitutes between 5-10% of the total weight of the coating.

11. An imagable article as claimed in claim 1, wherein the imagable article is a precursor to a lithographic printing form, a precursor to a mask, or a precursor to an electronic part.

* * * * *